(12) United States Patent
Pisau (10) Patent No.: US 10,164,629 B2
(45) Date of Patent: Dec. 25, 2018

(54) METHOD AND APPARATUS FOR CONTROLLING CURRENT SLEW RATE OF A SWITCHING CURRENT THROUGH AN EXTERNAL RESISTIVE LOAD

(71) Applicant: Omron Automotive Electronics, Inc, St. Charles, IL (US)

(72) Inventor: Lucretiu Pisau, Highland Park, IL (US)

(73) Assignee: Omron Automotive Electronics, Inc., St. Charles, IL (US)

( * ) Notice: Subject to any disclaimer, the term of this patent is extended or adjusted under 35 U.S.C. 154(b) by 157 days.

(21) Appl. No.: 14/132,970

(22) Filed: Dec. 18, 2013

(65) Prior Publication Data

US 2015/0171859 A1    Jun. 18, 2015

(51) Int. Cl.
*H03K 17/687* (2006.01)
*H03K 17/30* (2006.01)
*H03K 17/16* (2006.01)

(52) U.S. Cl.
CPC ......... *H03K 17/302* (2013.01); *H03K 17/165* (2013.01)

(58) Field of Classification Search
None
See application file for complete search history.

(56) References Cited

U.S. PATENT DOCUMENTS

| | | | |
|---|---|---|---|
| 5,550,446 A | 8/1996 | Schlager et al. | |
| 2007/0285854 A1* | 12/2007 | Rodgers et al. | 361/56 |
| 2010/0172060 A1* | 7/2010 | Woo et al. | 361/56 |
| 2010/0259328 A1* | 10/2010 | Giovannotto | 330/195 |
| 2012/0086382 A1* | 4/2012 | Peto | 318/729 |
| 2014/0301588 A1* | 10/2014 | Glover | 381/354 |

FOREIGN PATENT DOCUMENTS

WO    9524076 A1    9/1995

OTHER PUBLICATIONS

Ice, C., et al., "Digital Control Brings More Efficiency to DC/DC Converters," Digital Power; www.microchip.com. Power Electronics Europe. www.power-mag.com. 2011. pp. 17-19. Issue 5.

* cited by examiner

*Primary Examiner* — Lincoln Donovan
*Assistant Examiner* — Khareem E Almo
(74) *Attorney, Agent, or Firm* — Murphy, Bilak & Homiller, PLLC (57) ABSTRACT

In one aspect of the teachings herein, a switching circuit for switching a power transistor is configured to control the slew rate of the switched load current in a manner that yields substantial independence from the load voltage, based on the use of a Miller-effect compensation capacitor and controllable source resistances for driving the gate or base of the power transistor. In a non-limiting example, a control circuit, such as a microcontroller, uses a set of bidirectional input/output ports to drive the transistor base or gate through a selectable combination of parallel resistors, so that the effective source resistance for transistor turn-on and turn-off is selectable by configuring different combinations of input/output settings for the set of bidirectional input/output ports. Controlling the source resistance in this manner allows the control circuit to set or otherwise control the slew rate of the load current.

22 Claims, 4 Drawing Sheets

METHOD AND APPARATUS FOR CONTROLLING CURRENT SLEW RATE OF A SWITCHING CURRENT THROUGH AN EXTERNAL RESISTIVE LOAD

TECHNICAL FIELD

The present invention generally relates to power electronics, and particularly relates to controlling current slew rate of a switched current through an external load.

BACKGROUND

A capacitor C coupled between the input and output terminals of an amplifier with a voltage gain of −Av experiences a net voltage across its terminals of Vin*(1+Av). This multiplicative effect means that the effective capacitance seen looking into the input terminal is C*(1+Av), which is a well understood example of the "Miller effect." Field Effect Transistors or FETS inherently include a certain amount of parasitic drain-to-gate capacitance, which exhibits the Miller effect when FETs are used, for example, as inverting voltage amplifiers.

The Miller effect is a well-understood phenomenon and is exploited in the design of audio amplifiers and other electronic circuits, such as for limiting amplifier bandwidth and enhancing stability. Load-switching circuits represent an example scenario where the Miller effect is used to control voltage slew rates. In a representative configuration, an FET or other transistor is configured as a high-side or low-side switch that switches current through a load. Miller effect compensation is sometimes used in such circuits to limit the voltage slew rates associated with switching the transistor on and off.

However, it is recognized herein that such circuit arrangements leave unaddressed certain practical issues. For example, Miller compensation is not traditionally used to control the current slew rates of a load-switching transistor circuit, e.g., for reducing Electro-Magnetic Interference or EMI, and particularly not in a manner that is substantially independent of the associated load voltages. Moreover, it s recognized herein that traditional approaches for implementing the switching circuitry used for power transistor switching do not consider the problems arising from asymmetrical positioning of the switching control voltages with respect to the turn-on threshold of the switching transistor.

SUMMARY

In one aspect of the teachings herein, a switching circuit for switching a power transistor is configured to control the slew rate of the switched load current in a manner that yields substantial independence from the load voltage, based on the use of a Miller-effect compensation capacitor and controllable source resistances for driving the gate or base of the power transistor. In a non-limiting example, a control circuit, such as a microcontroller, uses a set of bidirectional input/output ports to drive the transistor base or gate through a selectable combination of parallel resistors, so that the effective source resistance for transistor turn-on and turn-off is selectable by configuring different combinations of input/output settings for the set of bidirectional input/output ports. Controlling the source resistance in this manner allows the control circuit to set or otherwise control the slew rate of the load current.

More broadly, in an example embodiment, a switching circuit includes a transistor for switching a current through an external resistive load, and a compensation capacitor that is external to the transistor and coupled between a first terminal and a second terminal of the transistor. The first terminal is a gate or a base terminal of the transistor and the second terminal is a drain or a collector terminal of the transistor. The switching circuit further includes a control circuit coupled to the first terminal of the transistor through a selectable source resistance. The control circuit is configured to control a slew rate of the current through the load by selecting a first source resistance that in combination with the compensation capacitor yields a first time constant for turning the transistor on, and by selecting a second source resistance that in combination with the compensation capacitor yields a second time constant for turning the transistor off.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
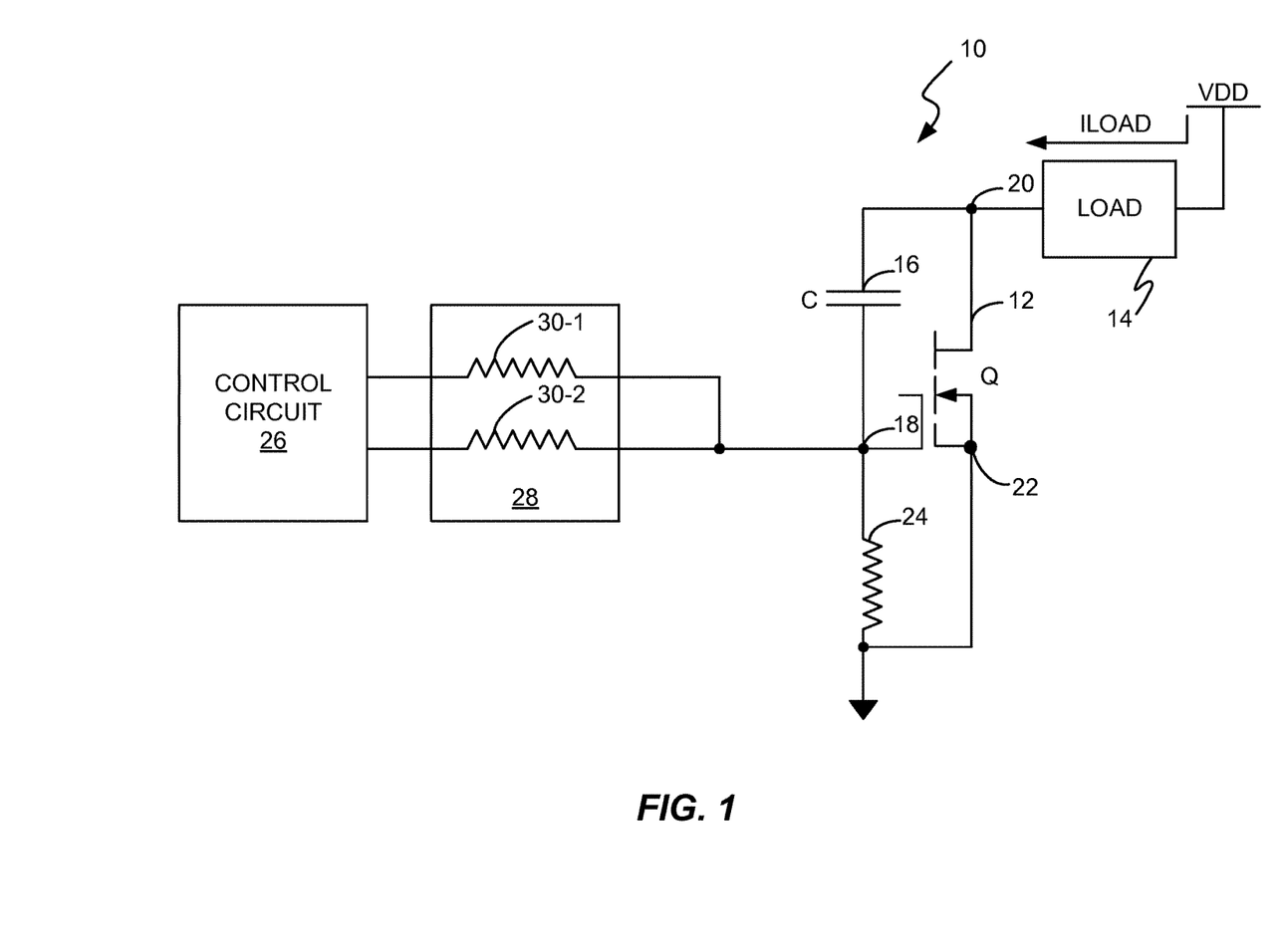
FIG. 1 is an example block diagram of one embodiment of a switching circuit configured to control a slew rate of a switched current through a load.

FIG. 1 illustrates an example switching circuit 10 that includes a transistor 12 for switching a current, $I_{LOAD}$, through an external resistive load 14. The switching circuit 10 further includes a compensation capacitor 16 that is external to the transistor 12 and coupled between a first terminal 18 and a second terminal 20 of the transistor 12. The first terminal 18 is a gate or a base terminal of the transistor 12 and the second terminal 20 is a drain or a collector terminal of the transistor 12.

The capacitor 16, having a capacitance value of "C" in the diagram, couples the output terminal 20 of the transistor 12 to the input terminal 18 of the transistor 12, and thus operates as a Miller effect capacitor, otherwise referred to herein as a "compensation" capacitor. In an example case, the compensation capacitor 16 is at least an order of magnitude larger in terms of its capacitance value than any parasitic Miller capacitance internal to the transistor 12. The transistor 12 is further shown with its third terminal 22, i.e., its source or emitter terminal, coupled to signal ground and the base terminal 18 also may be pulled down to signal ground through an optional pull-down resistor 24. However, in some configurations, pull-down is affected using a control circuit 26, which is part of the overall switching circuit 10.

The control circuit 26 is coupled to the first terminal 18 of the transistor 12 through a selectable source resistance 28. In the example diagram, the selectable source resistance 28 includes two selectable source resistances 30-1 and 30-2. Correspondingly, the control circuit 26 is configured to control a slew rate of the current through the load 14, by selecting the first source resistance 30-1, which in combination with the compensation capacitor 16 yields a first time constant $\tau_1$ for turning the transistor 12 on, and by selecting a second source resistance 30-2, which in combination with the compensation capacitor 16 yields a second time constant $\tau_2$ for turning the transistor 12 off. That is, the control circuit 26 turns the transistor 12 through the first source resistance 30-1 and turns the transistor 12 off through the second source resistance 30-2.

In some embodiments, the first source resistance 30-1 and the second source resistance 30-2 are set to pre-determined values in accordance with a nominal value of the compensation capacitor 16 and a nominal value of the resistance of the load 14, to meet a target slew rate of the current through the load 14 for turn on and turn off. The on and off current slew rate targets may be, but are not necessarily, the same.

In one or more other embodiments, the control circuit 26 is configured to adjust the value of one or both the first source resistance 30-1 and the second source resistance 30-2. Adjustability in this regard enables the control circuit 26 to adjust the current slew rate associated with transistor turn-on and/or turn-off. Such adjustments may be made once, e.g., at start-up to set the first and second source resistances 30-1 and 30-2 to values appropriate for the size of the load 14, which may be indicated by the control circuit 26 via signaling, via jumper configurations, etc. However, such adjustments may be made dynamically, too, such as during calibration operations and/or over time, to accommodate component variances and aging. The control circuit 26 may perform such adjustments on a commanded basis or automatically, such as every x-th power cycle, where x represents some number of power cycles that represent some expected duration of time.

Broadly, in at least one embodiment, the switching circuit 26 is configured to adjust the value of the first source resistance 30-1 according to a target slew rate for a rising current through the load 14 when turning the transistor 12 on, and to adjust the value of the second source resistance 30-2 according to a target slew rate for a falling current through the load 14 when turning the transistor 12 off. As detailed later herein, the control circuit 26 in one or more embodiments is configured to adjust the value of one or both the first source resistance 30-1 and the second source resistance 30-2, based on comparing a target slew rate to a measured slew rate of the current through the load 14 during turn on and/or turn off of the transistor 12.

In at least one embodiment, the control circuit 26 adjusts the value of one or both the first source resistance 30-1 and the second source resistance 30-2 by selecting a parallel combination of resistors from among a set of discrete resistors that individually are controllably switched into and out of electrical connection with the first terminal 18 of the transistor 12. By way of example, FIG. 2 illustrates one such embodiment of the switching circuit 10.

Figure 2:
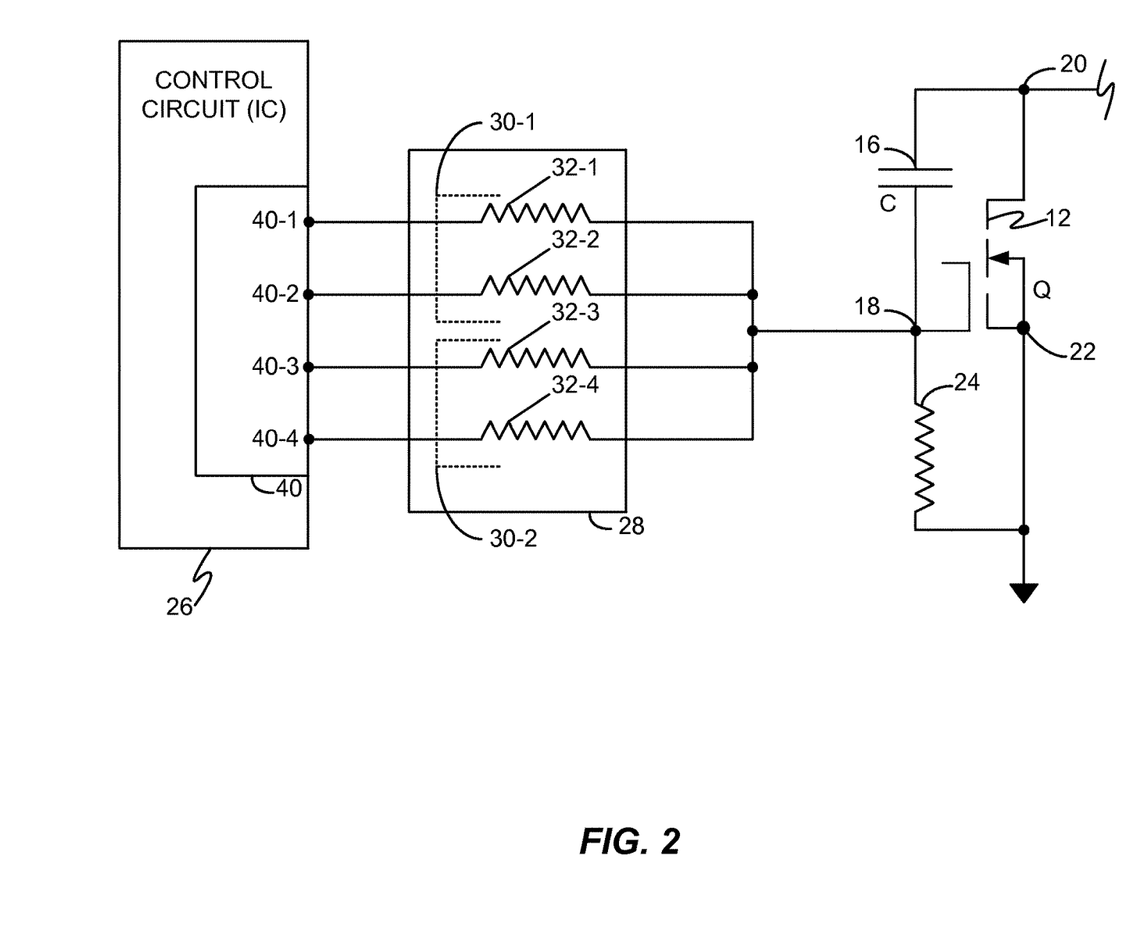
FIG. 2 is a circuit diagram illustrating example details for one embodiment of the switching circuit.

According to the example details in FIG. 2, the selectable source resistance 28 comprises a parallel set of resistors 32, including individual resistors 32-1, 32-2, 32-3 and 32-4. As used herein, "32" may refer generically to all of the parallel resistors, or may refer generically to a particular one of them. The plural and singular usages will be clear from the context, and where needed for clarity, individual suffixes are used.

Some or all of the parallel resistors 32 may have different values, which provides greater flexibility in forming different effective resistance values via different sub-combinations of the overall set of parallel resistors 32. In the diagram, the sub-combination of parallel resistors 32-1 and 32-2 represents the first source resistance 30-1, while the sub-combination of parallel resistors 32-3 and 32-4 represents the second source resistance 30-2. These examples are non-limiting. For example, one or more of the particular parallel resistors 32 used to make up the first source resistance 30-1 also may be used to make up the second source resistance 30-2.

It is also noted that having one or more of the parallel resistors 32 much larger than the remaining parallel resistors 32 may yield a wider and more flexible range of effective resistances. For example, the resistor 32-3 may be set to 68 kOhms, 75 kOhms, or the like, while the other resistors 32 are set in the range of 4.7 kOhms to 15 kOhms. This arrangement permits the resistor 32-3 to be used to make slight reductions in effective resistance by adding it in parallel with any of the other resistors 32-1, 32-2 and 32-4, or any combination of those other resistors 32.

In complementary implementation, the control circuit 26 comprises an integrated circuit having a set of bidirectional input/output ports 40, which by way of example includes four individual bidirectional input/output ports 40-1, 40-2, 40-3 and 40-4. Hereafter, the term "ports 40" will be used as a generic reference to the bidirectional input/output ports 40, and the term "port 40" will be used as a generic reference to any given one of them. The suffixes will be used only where needed for clarity.

Each port 40 is coupled to the first terminal 18 of the transistor 12 through a respective resistor 32. That is, respective ones of the ports 40 are coupled to the gate or base terminal 18 of the transistor 12 through respective ones of the parallel resistors 32 implemented within the selectable source resistance 28. Each port 40 is configurable to adopt one of three states or conditions: an output high state, an output low state, and an input state. The two output states can be generally characterized as a "low impedance" output state.

When a given one of the ports 40 is set to the output high state, the port 40 acts as relatively stiff current source tied to the positive supply rail of the control circuit 26, e.g., the +5 VDC or other logic-level supply voltage. In the high output state, a port 40 is regarded as being at a first control voltage. Conversely, when a given one of the ports 40 is set to the output low state, the port 40 acts as relatively stiff current sink tied to signal ground. In the low output state, a port 40 is regarded as being at a second control voltage. When a given one of the ports 40 is set to the input state, the port 40 becomes a high-impedance input that neither sinks nor sources current.

Those of ordinary skill in the art will therefore appreciate that the effective source resistance seen by the control circuit 26 looking into the first terminal 18 of the transistor 12 and the resulting turn-on or turn-off time constant with respect to the compensation capacitor 16 are controllable by configuring the ports 40 to have a particular combination of states. In at least one embodiment, the control circuit 26 is configured to turn on the transistor 12 according to a first port configuration and to turn off the transistor 12 according to a second port configuration.

Each port configuration defines which ones of the ports 40 are configured as low-impedance outputs, with the remaining ones being configured as high-impedance inputs. It may be that for transistor turn on, the control circuit 26 turns on one or more of the ports 40 as high outputs and leaves the remaining ports 40 as high-impedance inputs. However, an even greater number of effective source resistances and corresponding time constants can be created by enabling a mix of ports 40 as high outputs and low outputs, along with setting any of the remaining ports 40 as high-impedance inputs.

While the integrated-circuit implementation of the control circuit 26 is based on non-computer circuitry in some embodiments, e.g., simple programmable logic devices or even discrete transistor circuits, other embodiments exploit the control and integration available in computer-based circuitry. Examples of computer-based circuitry include a microprocessor or microcontroller, a DSP, or other type of digital processing circuit, such as may be implemented in an ASIC, FPGA, etc. As a particular but non-limiting example, the control circuit 26 comprises a programmed microprocessor, where the term "microprocessor" should be understood as encompassing microcontrollers, DSPs, and the like.

In such microprocessor embodiments, the control circuit 26 is configured to set or update the first and second port configurations during at least one of a startup phase of operation and a run-time phase of operation, based on comparing a measured slew rate of the current through the load during transistor 12 turn on and turn off with a corresponding target slew rate. See FIG. 3 for an example implementation of the switching circuit 10 according to such functionality.

Figure 3:
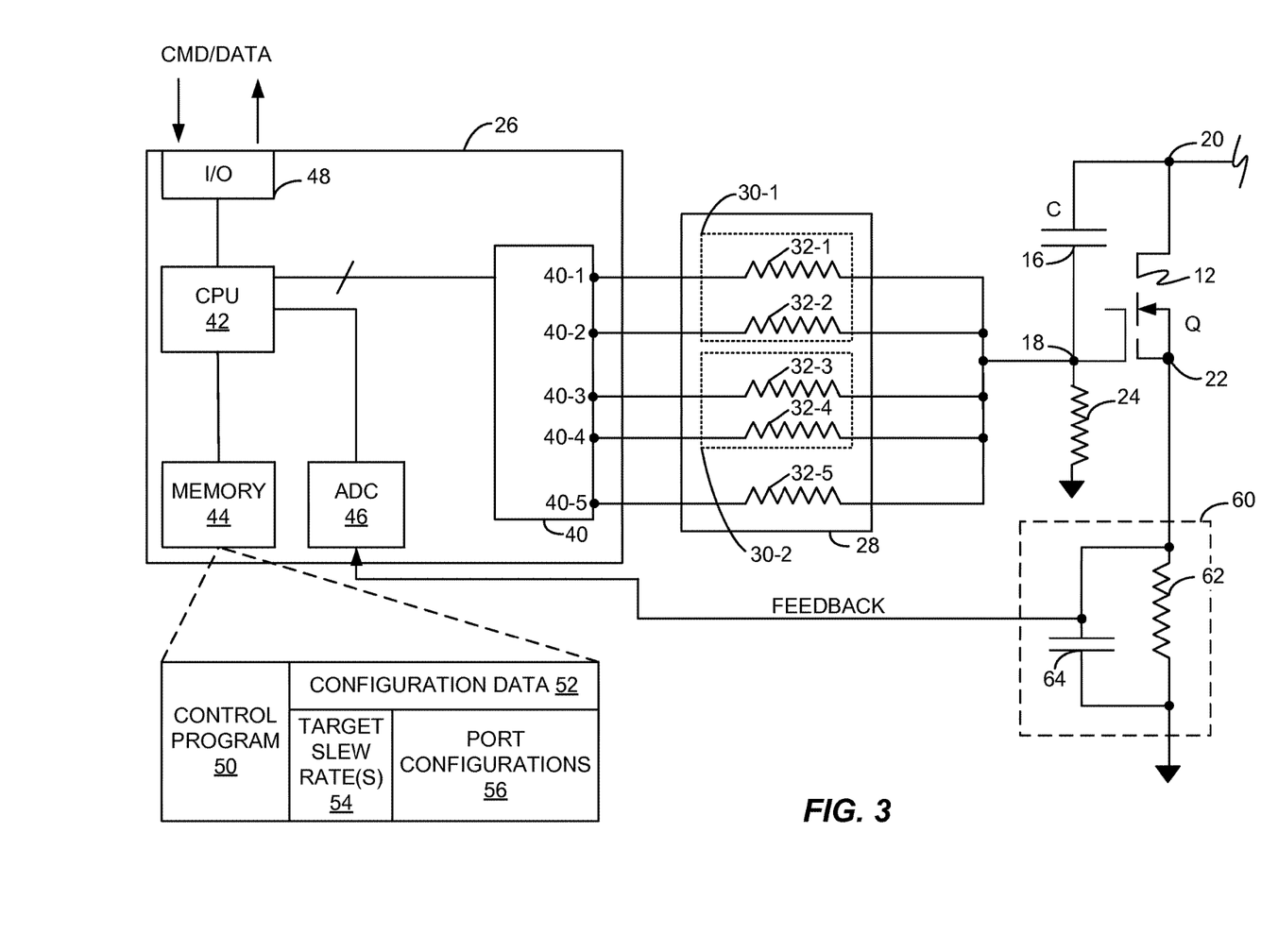
FIG. 3 is an example circuit diagram illustrating example details for another embodiment of the switching circuit.

In FIG. 3, the control circuit 26 comprises a microprocessor or other programmed digital processing circuit that includes the previously described ports 40, along with a CPU or other processing unit 42, memory 44, and an analog-to-digital converter or ADC 46. The memory 44 comprises one or more types of computer-readable media that provides for persistent storage of a control program 50 and configuration data 52.

In an example embodiment, the configuration data 52 is a look-up table or other data structure that stores one or more target slew rates 54 and corresponding port configuration settings 56. For example, a stored target slew rates 54 comprises a numerical value representing a target turn-on slew rate for load current through the transistor 12. The value may be expressed as a delta between ADC counts taken at defined measurement intervals during transistor turn on, or in some other format that is sensible for the measurement arrangement used to measure actual load current and derive current slew rate therefrom. Regardless of its format, this value is logically linked or bound to corresponding port configuration setting that sets the ports 40 to a combination of input/output states that yields a value for the first source resistance 30-1 so that the target slew rate is met. Additional pairs of target slew rate values and port settings can be stored, e.g., for any number of turn-on and/or turn-off slew rates.

In at least some embodiments, the control circuit 26 is configured to dynamically update the first and second port configurations responsive to detecting that a measured slew rate of the current through the load 14 deviates from a target slew rate by more than a defined amount, e.g., more than a ten-percent error. For example, the control circuit 26 uses the ADC 46 to measure the actual slew rate of the current through the load 14 via a current-sense circuit 60, which includes a low-Ohm sense resistor 62 that is in series with the source or emitter terminal 20 of the transistor 12 and a corresponding filter capacitor 64. This arrangement provides a voltage proportional to load current, which voltage is digitized by the ADC 46 and evaluated by the CPU 42 for turn-on and turn-off events.

By digitizing the load current at intervals having a known duration, the control circuit 26 calculates the change in current between measurements or across a set of time measurements, to determine the current slew rate. Such determinations may be made over multiple turn-on and/or turn-off cycles and filtering may be applied for greater accuracy. Of course, the illustrated circuit arrangement is non-limiting. For example, if the ADC 46 does not provide high-impedance inputs, the current-sense circuit 60 may include a buffer amplifier between the ADC input and the sense resistor 60.

Figure 4:
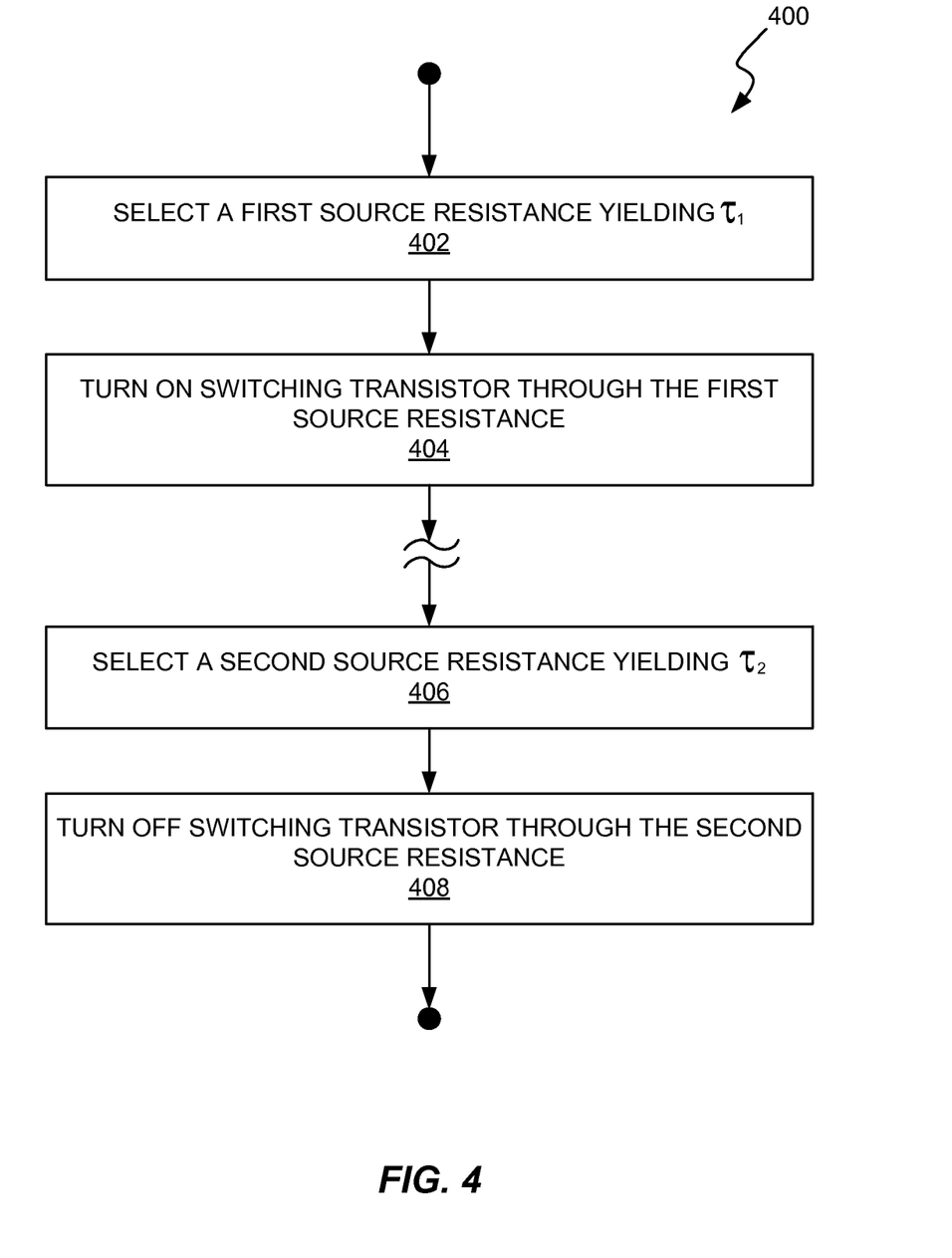
FIG. 4 is a flow diagram of one embodiment of a method to control a slew rate of a switched current via a switching circuit.

FIG. 4 illustrates a method 400 for controlling a slew rate of a current through a load 14 via a switching circuit 10. However, the method 400 is not limited to any of the example circuit details of the switching circuit 10 detailed herein for purposes of discussion. Further, it will be appreciated that the method 400 may be implemented by a switching circuit 10 based on the execution of computer program instructions stored in a computer-readable medium, e.g., based on execution of the control program 50 illustrated in FIG. 3. Such execution specially adapts the CPU 42 show in FIG. 3, or other such digital processing circuitry, to carry out the current slew-rate control algorithm as explained herein.

It will also be appreciated that one or more processing steps of the method 400 may be performed in an order other than that suggested by the logic flow diagram. Additionally, or alternatively, the method 400 or parts of it may be performed in a looped or repeated fashion, and may be performed independently with respect to different loads 14 and corresponding switching transistors 12, or may be performed with respect to any one of a number of configurable slew rate targets, e.g., on circuit start-up or during a configuration phase, the control circuit 26 selects the target slew rate(s) to use from the configuration data 52.

With the above qualifications in mind, and with example reference back to reference numbers introduced in FIG. 1, the method 400 includes selecting (Block 402) a first source resistance 30-1 that in combination with a compensation capacitor 16 yields a first time constant for turning on a transistor 12 in the switching circuit 10, wherein the transistor 12 switches the current through a load 14. The method 400 further includes turning on (Block 404) the transistor 12 through the first source resistance 30-1 and, at some subsequent time, selecting (Block 406) a second source resistance 30-2 that in combination with the compensation capacitor 16 yields a second time constant $\tau_2$ for turning off the transistor 12. Correspondingly, the method 400 includes turning off (Block 408) the transistor 12 through the second source resistance 30-2.

In the context of the method 400, "selecting" the first source resistance 30-1 may simply comprise selecting the particular resistor 32 or combination of resistors in a pre-programmed fashion, or it may involve a more intelligent selection process based on determining a desired or target slew rate and correspondingly selecting a particular port configuration from the configuration data 52. Similarly, selecting the second source resistance 30-2 may simply comprise selecting or otherwise activating one or more resistors 32 in a preprogrammed fashion, for transistor turn off, or a more intelligent selection process involving the configuration data 52, such as may be driven based on measurements of actual load current slew rate.

The time between transistor turn-on and turn-off represents the on-time for the transistor 12. The on-time may be fixed or may be set, e.g., by another circuit according to the intended operation of the switching circuit 10.

In at least one example, the switching circuit 10 is controlled as part of an overall Pulse-Width-Modulation or PWM circuit, and the load 14 is a resistive load, such as a wire-wound resistor configured as a heating element. In such configurations, the transistor on-time is PWM controlled according to a user-adjustable temperature set point. The slew rate control taught herein is particularly advantageous as it may be configured to otherwise dynamically control in order to provide relatively slow rise and fall times for the load current, thereby reducing or eliminating EMI associated with switching multi-amp heater currents. EMI control is critical, for example, in automotive applications, such as where the switching circuit 10 provides switching control for one or more seat heating modules as loads 14, and where stringent limits on coupled and radiated EMI apply.

The microprocessor-based embodiment of FIG. 3 is, for example, configured as a PWM controller that receives temperature or other control set-point information through one or more interface circuits 48. In such an example, a seat heater control value is provided to the control circuit 26 and it correspondingly controls the on-time for a transistor 12 that is used to switch a resistive load 14 that functions as the seat heater. The control circuit 26 uses PWM PWM-based control for temperature set-point management and uses the current slew rate control taught herein for EMI management. Multiple loads 14 may be so controlled, e.g., for multiple heated seats and/or for multiple heating elements within each such seat.

Further among the several advantages of the current slew-rate control algorithm taught herein, the control circuit 26 can be configured to compensate for the asymmetry between its supply voltage rails and the turn-on threshold of the transistor 12. For example, the control circuit 26 may operate with supply rails of +5 VDC and 0 VDC, whereas the turn-on threshold voltage of the transistor 12 is, e.g., 1.5 VDC. This asymmetrical positioning means that the compensation capacitor 16 has to discharge further for turning off the transistor 12 than it has to charge for turning on the transistor 12. The use of selectable first and second source resistances 30-1 and 30-2 as taught herein perfectly complements this arrangement. That is, the effective source resistance for turning on the transistor 12 can be set more or less independently from the effective source resistance used for turning off the transistor 12.

Thus, in one or more embodiments, it will be appreciated that the threshold voltage of the transistor 12 is positioned asymmetrically with respect to first and second control voltages output by the control circuit 26 for transistor turn on and turn off, respectively, and that the first and second source resistances 30-1 and 30-2 are sized to yield different first and second time constants that compensate for the asymmetrical positioning. Here, the resistor "size" denotes its resistance in Ohms, and the first and second control voltages will be understood as the output high and output low voltages associated with the ports 40. The typical port 40 will drive high to within a few hundred millivolts of the positive supply rail used to power the port 40, and will pull low to within a few hundred millivolts of reference ground.

In an example of compensating for the asymmetrical voltage positioning, the first and second source resistances 30-1 and 30-2 are sized to yield nominally the same slew rate of the current through the load 14 when the transistor 12 is turned on and turned off. In other embodiments, the on and off current slew rates are different. However, in all cases, the control circuit 26 is configured to limit the current slew rate through the load 14 during the on and off switching events effected via the transistor 12.

The above arrangement(s) and method(s) have the advantage of providing desired current slew rate control, e.g., targeted values of mA/us, as opposed to voltage slew rate control, and does so essentially independent of the load voltage, shown in FIG. 3 as "VDD." The selectable gate resistors 32 included within the selectable source resistance 28 allow for easy adjustments to the current slew rates via software or other adaptable circuitry. For example, coupling bidirectional input/output ports in parallel to the gate or base terminal 18 of the transistor 12 through respective individual resistors 32, allows the control circuit 26 60 to decide at run time which resistor 32 or combination of resistors 32 to use, in order to achieve a desired current slew rate. Such operation enables dynamic compensation for changes in component or load characteristics.

Notably, modifications and other embodiments of the disclosed invention(s) will come to mind to one skilled in the art having the benefit of the teachings presented in the foregoing descriptions and the associated drawings. For example, the teachings herein apply directly to high-side switching with respect to a load, in addition to low-side switching. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A switching circuit configured for pulse-width-modulation (PWM) switching of a power transistor for a targeted power dissipation in a resistive load coupled to the power transistor, the switching circuit comprising:
   the power transistor;
   a compensation capacitor configured as a Miller-effect capacitance for the power transistor; and
   a control circuit configured to:
      switch the power transistor on and off according to PWM control parameters defining on times and off times of the power transistor, the PWM control parameters being dependent on the targeted power dissipation; and
      limit a slew rate of current through the resistive load during PWM switching of the power transistor by, at each instance of turning the power transistor on, controlling a turn-on time constant of the power transistor, and at each instance of turning the power transistor off, controlling a turn-off time constant of the power transistor;
   wherein the control circuit is configured to control the turn-on time constant of the power transistor by outputting a turn-on control voltage to a control terminal of the transistor through a first source resistance that, in combination with the value of the turn-on control voltage, a threshold voltage of the power transistor, and a Miller-effect capacitance of the power transistor, sets the turn-on time constant, and is configured to control the turn-off time constant of the power transistor by outputting a turn-off control voltage to the control terminal of the transistor through a second source resistance that, in combination with the value of the turn-off control voltage, the threshold voltage of the power transistor, and the Miller-effect capacitance of the power transistor, sets the turn-off time constant.

2. The switching circuit of claim 1, wherein the first source resistance and the second source resistance are set to pre-determined values in accordance with a nominal value of the compensation capacitor and a nominal value of the resistance of the resistive load, to yield a target slew rate of the current through the resistive load.

3. The switching circuit of claim 1, wherein the control circuit is configured to adjust the value of the first source resistance according to a target slew rate for a rising current through the resistive load when turning the power transistor on, and to adjust the value of the second source resistance according to a target slew rate for a falling current through the resistive load when turning the power transistor off.

4. The switching circuit of claim 1, wherein the control circuit is configured to receive a feedback signal that is proportional to the slew rate of the current through the resistive load, and wherein the control circuit is configured to adjust the value of one or both the first source resistance and the second source resistance based on comparing a value of the feedback signal acquired during turn on or turn off of the power transistor to a stored value defining a target slew rate.

5. The switching circuit of claim 4, wherein the control circuit adjusts the value of one or both the first source resistance and the second source resistance by selecting a parallel combination of resistors from among a set of discrete resistors that individually are controllably switched by the control circuit into and out of electrical connection with the control terminal of the power transistor.

6. The switching circuit of claim 1, wherein a threshold voltage of the power transistor is positioned asymmetrically with respect to the turn-on and turn-off control voltages, and wherein the first and second source resistances are sized to yield different turn-on and turn-off time constants that compensate for said asymmetrical positioning.

7. The switching circuit of claim 6, wherein the first and second source resistances are sized to yield nominally the same slew rate of the current through the resistive load when the power transistor is turned on and turned off.

8. The switching circuit of claim 1, wherein the control circuit comprises an integrated circuit having a set of bidirectional input/output ports, each input/output port being coupled to the control terminal of the power transistor through a respective resistor, and wherein the control circuit is configured to turn on the power transistor according to a first port configuration and to turn off the power transistor according to a second port configuration, wherein each port configuration defines which ones of the input/output ports are configured as low-impedance outputs, with the remaining ones being configured as high-impedance inputs.

9. The switching circuit of claim 8, wherein the control circuit comprises a programmed microprocessor.

10. The switching circuit of claim 8, wherein the control circuit is configured to set or update the first and second port configurations during at least one of a startup phase of operation and a run-time phase of operation, based on comparing a measured slew rate of the current through the resistive load during transistor turn on and turn off with a corresponding target slew rate.

11. The switching circuit of claim 8, wherein the control circuit is configured to dynamically update the first and second port configurations responsive to detecting that a measured slew rate of the current through the resistive load deviates from a target slew rate by more than a defined amount.

12. A method of pulse-width-modulation (PWM) switching of a power transistor for a targeted power dissipation in a resistive load coupled to the power transistor, the method comprising:
switching the power transistor on and off according to PWM control parameters defining on times and off times of the power transistor, the PWM control parameters being dependent on the targeted power dissipation; and
limiting a current slew rate through the resistive load during PWM switching of the power transistor by, at each instance of turning the power transistor on, controlling a turn-on time constant of the power transistor, and at each instance of turning the power transistor off, controlling a turn-off time constant of the power transistor;
wherein controlling the turn-on time constant of the power transistor comprises outputting a turn-on control voltage to a control terminal of the transistor through a first source resistance that, in combination with the value of the turn-on control voltage, a threshold voltage of the power transistor, and a Miller-effect capacitance of the power transistor, sets the turn-on time constant, and wherein controlling the turn-off time constant of the power transistor comprises outputting a turn-off control voltage to the control terminal of the transistor through a second source resistance that, in combination with the value of the turn-off control voltage, the threshold voltage of the power transistor, and the Miller-effect capacitance of the power transistor, sets the turn-off time constant.

13. The method of claim 12, wherein the first and the second source resistances have pre-determined values based on a nominal value of the compensation capacitor and a nominal value of a resistance of the resistive load, to yield a target slew rate of the current through the load.

14. The method of claim 12, wherein the method includes adjusting the value of the first source resistance according to a target slew rate for a rising current through the resistive load when turning the power transistor on, and adjusting the value of the second source resistance according to a target slew rate for a falling current through the resistive load when turning the power transistor off.

15. The method of claim 12, wherein the method includes receiving a feedback signal that is proportional to the slew rate of the current through the resistive load and adjusting the value of one or both the first and second source resistances, based on comparing a value of the feedback signal acquired during turn on or turn off of the power transistor to a stored value defining a target slew rate.

16. The method of claim 15, wherein adjusting the value of one or both the first and second source resistances comprises selecting a particular parallel combination of resistors from among a set of discrete resistors.

17. The method of claim 12, further comprising setting the value of the first source resistance by configuring a set of bi-directional input/output ports according to a first port configuration, so that one or more of them are set as low-impedance outputs and the remaining ones of them are set as high-impedance inputs, said set of ports belonging to a control circuit and used by the control circuit to output the turn-on and turn-off control voltages, and where each port is coupled to the control terminal of the power transistor through a respective resistor, and setting the value of the second source resistance by configuring the set of ports according to a second port configuration.

18. The method of claim 17, further comprising updating the first and second port configurations during at least one of a startup phase of operation and a run-time phase of operation, based on comparing a measured slew rate of the current through the resistive load during transistor turn on and turn off with a corresponding target slew rate.

19. A switching circuit comprising:
a transistor for switching a current through an external resistive load;
a compensation capacitor external to the transistor and coupled between a first terminal and a second terminal of the transistor, wherein the first terminal is a gate or a base terminal of the transistor and the second terminal is a drain or a collector terminal of the transistor; and a control circuit coupled to the first terminal of the transistor through a selectable source resistance, said control circuit configured to control a slew rate of the current through the load by selecting a first source resistance that in combination with the compensation capacitor yields a first time constant for turning the transistor on, and selecting a second source resistance that in combination with the compensation capacitor yields a second time constant for turning the transistor off;

wherein the control circuit comprises an integrated circuit having a set of bidirectional input/output ports, each input/output port being coupled to the first terminal of the transistor through a respective resistor, and wherein the control circuit is configured to turn on the transistor according to a first port configuration and to turn off the transistor according to a second port configuration, wherein each port configuration defines which ones of the input/output ports are configured as low-impedance outputs, with the remaining ones being configured as high-impedance inputs.

20. The switching circuit of claim 19, wherein the control circuit comprises a programmed microprocessor.

21. The switching circuit of claim 19, wherein the control circuit is configured to set or update the first and second port configurations during at least one of a startup phase of operation and a run-time phase of operation, based on comparing a measured slew rate of the current through the load during transistor turn on and turn off with a corresponding target slew rate.

22. The switching circuit of claim 19, wherein the control circuit is configured to dynamically update the first and second port configurations responsive to detecting that a measured slew rate of the current through the load deviates from a target slew rate by more than a defined amount.

* * * * *